United States Patent [19]

Gomi

[11] Patent Number: 5,010,026

[45] Date of Patent: Apr. 23, 1991

[54] PROCESS FOR MAKING BIPOLAR TRANSISTOR

[75] Inventor: Takayuki Gomi, Tokyo, Japan

[73] Assignee: Sony Corporation, Tokyo, Japan

[21] Appl. No.: 391,880

[22] Filed: Aug. 10, 1989

[30] Foreign Application Priority Data

Aug. 12, 1988 [JP] Japan .................. 63-201360

[51] Int. Cl.⁵ .......................... H01L 21/331
[52] U.S. Cl. ......................... 437/31; 437/26; 437/38; 437/162; 437/203; 148/DIG. 157; 357/34
[58] Field of Search ............ 437/31, 32, 33, 161, 437/162, 26, 27, 28, 203, 38; 357/34, 35; 148/DIG. 157

[56] References Cited

U.S. PATENT DOCUMENTS

| | | | |
|---|---|---|---|
| 4,066,473 | 1/1978 | O'Brien | 148/1.5 |
| 4,319,932 | 3/1982 | Jambotka | 437/31 |
| 4,495,010 | 1/1985 | Kranzer | 148/175 |
| 4,693,782 | 9/1987 | Kikuchi et al. | 437/31 |
| 4,851,362 | 7/1989 | Suzuki | 437/31 |
| 4,873,200 | 10/1989 | Kawakatsu | 437/31 |
| 4,887,145 | 12/1989 | Washio et al. | 357/59 |

FOREIGN PATENT DOCUMENTS

| | | | |
|---|---|---|---|
| 0029548 | 11/1980 | European Pat. Off. | |
| 0255882 | 7/1987 | European Pat. Off. | |
| 0329401 | 8/1989 | European Pat. Off. | 357/34 |
| 2396411 | 2/1977 | France. | |
| 64-28959 | 1/1989 | Japan. | |
| 64-31460 | 2/1989 | Japan. | |
| 64-31461 | 2/1989 | Japan. | |
| 1577405 | 10/1980 | United Kingdom. | |

OTHER PUBLICATIONS

Vacca, A., *Electronics*, Apr. 26, 1971, pp. 48–50.
Konaka, S. et al., *IEEE Trans. Electron Devices*, vol. ED-33, No. 4, Apr. 1986, pp. 526–530.
Antipov, I., *IBM Technical Disclosure Bulletin*, vol. 27, No. 8, Jan. 1985, pp. 4931–4933.

*Primary Examiner*—Brian E. Hearn
*Assistant Examiner*—T. N. Quach
*Attorney, Agent, or Firm*—Hill, Van Santen, Steadman & Simpson

[57] ABSTRACT

A bipolar transistor has a base region consisting of a graft base region, linking base region and an intrinsic base region, and a diffusion suppressing region of an opposite conductivity type to that of the base region is formed at least at the lower portion of the intrinsic base region. The junction depth of the linking base region is selected to be shallower than that of the intrinsic base region. Since the base to base linking is performed in the linking base region, collision between the intrinsic base region and the graft base region is inhibited, while the diffusion of the base width beyond the diffusion suppressing region is also inhibited. The junction depth of the linking base region is selected to be shallow to prevent the width of the parasitic base from being increased to suppress the side injection effect.

3 Claims, 4 Drawing Sheets

PROCESS FOR MAKING BIPOLAR TRANSISTOR

REFERENCES TO RELATED APPLICATIONS

This application is related to the application entitled "BIPOLAR TRANSISTOR AND METHOD OF FABRICATING SAME", assigned to the assignee of the present application, Ser. No. 309,235, filed Feb. 13, 1989 in which the invention is Takayuki Gomi.

BACKGROUND OF THE INVENTION

1. Field of the Invention

This invention relates to a high operating speed type bipolar transistor in which a base region of a second conductivity type is formed in a collector region of a first conductivity type and an emitter region of a first conductivity type is formed in the base region. More particularly, it relates to a bipolar transistor in which the base region is formed by a graft base region, a linking base region and an intrinsic base region.

2. Description of Prior Art

For producing a high speed high performance bipolar transistor, it is necessary to reduce the base width $W_B$, while it is also important to reduce the base resistance $R_{bb'}$.

As the production method for realization of this high performance, the present applicant has proposed a technique of forming a linking base region between an intrinsic base region as an active region and a graft base region which is produced by diffusing impurities from the base contact electrode. This technique is disclosed for example in the Japanese Patent Application Nos. 184898/1987, 188025/1987 and 188026/1987.

Meanwhile, in the technique of linking the intrinsic base region and the graft base region by the linking base region of the same conductivity type, there are caused damages when the linking base region is formed by ion implantation. These damages by ion implantation give rise to accelerated diffusion into the active region and to adverse effects due to so-called channeling tail. Among these adverse effects is the increase in the base junction depth that is caused in the course of the ensuring heat treatment. As described in the aforementioned Japanese Patent Application No. 184898/1987, there is also known a method comprising forming side walls on the lateral sides of the base contact electrode and utilizing these side walls to remove the substrate partially to form an emitter region and a base region of extreme small size and, above all, extremely shallow depth. However, the side injection effect of the emitter and the base presents itself to interfere with the high speed operation.

As a technique overcoming this inconvenience, the present applicant has already proposed in the Japanese Patent Application No. 33686/1988 a technique according to which a diffusion suppressing or restraining region having an opposite conductivity type to that of the base region is provided below the intrinsic base region.

However, for further elevating the performance of the bipolar transistor, it is necessary to prevent the width of, for example, the linking base region functioning as a parasitic base region from being increased, to suppress the side injection effect more completely.

SUMMARY OF THE INVENTION

It is therefore an object of the present invention to provide a bipolar transistor which is improved over the aforementioned prior art techniques and in which the effective base width of the parasitic base region is prevented from being increased to prevent deterioration of the characteristics caused by the side injection effect.

According to the bipolar transistor of the present invention, a base region is formed in a collector region. The base region is comprised of a graft base region, a linking base region and an intrinsic base region. An emitter region is formed within the intrinsic base region. A diffusion restraining region is formed under at least the intrinsic base region by introducing impurities having the opposite conductivity type to that of the impurities forming the base region. This diffusion restraining region may be extended to the lower portion of the linking base region. The linking base region provides for electrical connection between the intrinsic base region and the graft base region. For preventing the effective base width from being increased and also for preventing the characteristics from being deteriorated due to the side injection effects, the linking base region is so formed that its depth of diffusion is shallower than that of the intrinsic base region.

DETAILED DESCRIPTION OF THE INVENTION

Figure 1:
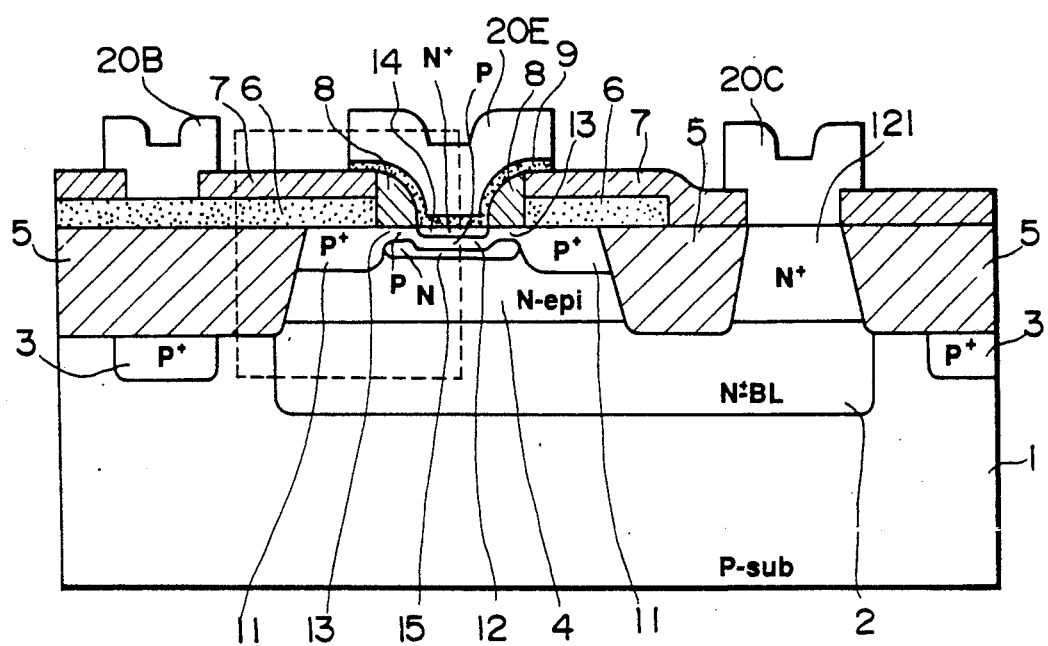
FIG. 1 is a sectional view of a bipolar transistor according to an embodiment of the present invention.

FIG. 1 shows the overall structure of the bipolar transistor according to an embodiment of the present invention. An N+ type buried layer 2 and a P+ type channel stop region 3 are formed on a P type silicon substrate 1, and an N type epitaxial layer 4 as the semiconductor substrate is formed thereabove. A field oxide film 5 for device isolation is formed adjacent to this N type epitaxial layer 4. This field oxide film 5 is a film of silicon oxide formed by a selective oxidation process. A polysilicon layer 6 covered by an interlayer insulating film 7 is formed on a portion of the upper surface of the epitaxial layer 4 surrounded by the field oxide film 5. This polysilicon layer 6 contains impurities and is used as a base contact electrode. The polysilicon layer 6 also functions as the diffusion source of impurities of the graft base region 11 formed in the epitaxial layer 4. Sidewall sections 8 are formed by etching back a CVD oxide film on the side wall of an opening formed in a portion of the polysilicon layer 6 on the epitaxial layer 4. These side wall sections 8 provide for emitter-base isolation, while the polysilicon layer 9 as the second layer may be utilized to form an intrinsic base region and an emitter region in a self-aligned manner. The thin polysilicon layer 9 is applied on the upper surfaces of the sidewall sections 8 and the epitaxial layer 4, and an emitter electrode 20E is formed thereabove by patterning an aluminium base interconnecting layer.

Figure 2:
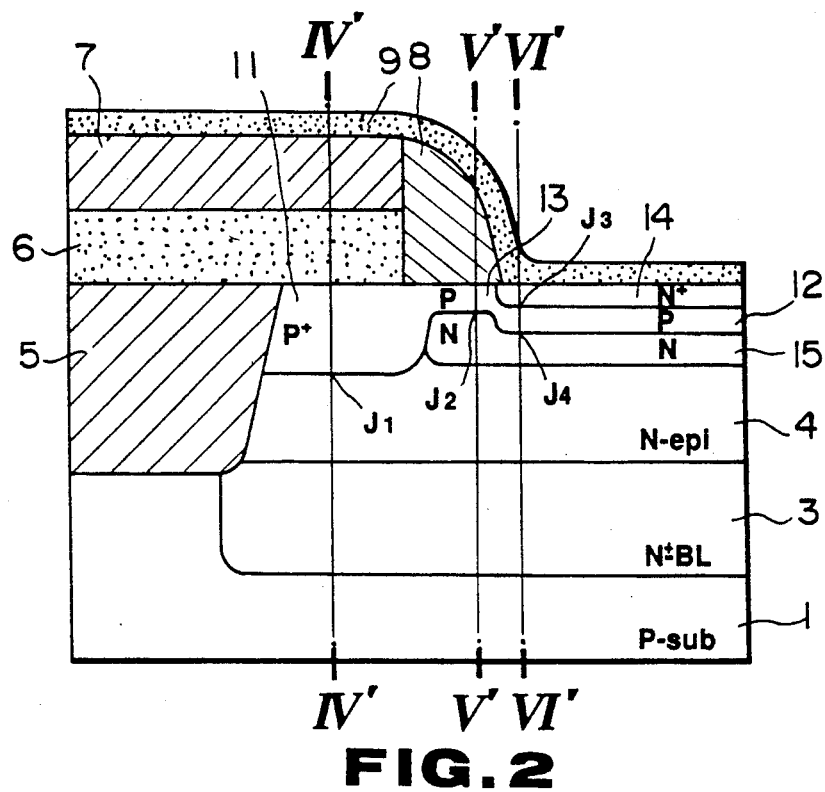
FIG. 2 is a sectional view showing essential parts thereof.

The epitaxial layer 4 at the opened portion is now explained by referring to FIG. 2. The P+ type graft base region 11 is formed by diffusion from the surface of the polysilicon layer 6 in contact with the epitaxial layer 4. This graft base region 11 is linked via a P type linking base region 13 with an intrinsic base region 12, which is the P+ type impurity diffused region. The linking base region 13 is formed from the vicinity of the end of the polysilicon layer 6 along the major surface of the epitaxial layer 4, and is linked at the bottom side of the sidewall sections 8 with the graft base region 11 in a partially overlapping relation therewith. The depth of junction $J_2$ of this linking base region 13 is selected to be shallower than the depth of junction $J_4$ of the intrinsic base region 12 and also than the depth of junction $J_1$ of the graft base region 11. The intrinsic base region 12 is formed by diffusing impurities from the thin polysilicon layer 9 extending on the sidewall section 8 and above the major surface and is linked in the active region with the linking base region 13 in a partially overlapping relation therewith. The depth of junction $J_4$ of this intrinsic base region 12 is selected to be deeper than the depth of junction $J_2$ of the linking base region 13, as mentioned hereinabove. Within the intrinsic base region 12 and in the epitaxial layer 4 below the polysilicon layer 9 is formed an emitter region 14 which is the N+ type semiconductor region. This emitter region 14 is formed by, for example, diffusing impurities from the polysilicon layer 9. Below the intrinsic base region 12 and the linking base region 13 is formed a diffusion suppressing or restraining region 15 for preventing the depth of these impurity diffused regions from being increased further. That is, impurities of the opposite conductivity type to that of the intrinsic base region 12 and the linking base region 13 are introduced below the intrinsic base region 12 and the linking base region 13 to maintain the N conductivity type in the region, such that the occasionally diffused impurities from the regions 12 and 13 are compensated to the opposite N conductivity type to prevent the depth of junction from being increased further.

Meanwhile, in FIG. 1, the buried layer 2 is linked via a collector contact region 121 to a collector region 21. On the other hand, the polysilicon layer 6, which is the base contact electrode, is linked with a base electrode 20B formed via a portion of the interlayer insulating film 7. The collector electrode 20C and the base electrode 20B are respectively formed by patterning an aluminium base interconnecting layer.

Figure 3:
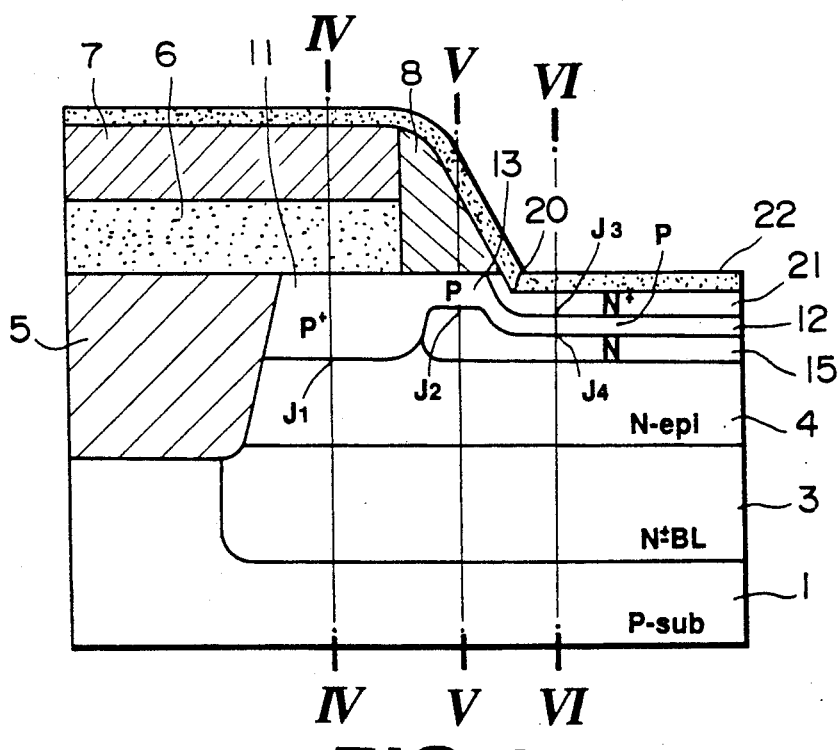
FIG. 3 is a sectional view showing a bipolar transistor according to a modified embodiment of the present invention.

FIG. 3 shows a modified embodiment of the bipolar transistor according to the present invention. In the present illustrative embodiment, the sidewall sections 8 are formed by RIE and, for removing the damage caused by RIE, the surface of the epitaxial layer 4 is etched, with the sidewall sections 8 and the interlayer insulating film 7 as the mask, for forming a step 20 on the surface of the epitaxial layer 4. A thin polysilicon layer 22 for diffusion is formed over the surface of the step 20, and an emitter region 21 is formed on the surface of the epitaxial layer 4. This step 20 is effective to remove the damage caused by RIE and to produce a shallow junction, thanks also to the aforementioned diffusion restraining region 15. The side injection effect may also be suppressed since the junction depth $J_2$ of the linking base region 13 is shallower than the junction depth $J_4$ of the intrinsic base region 12.

Figure 4:
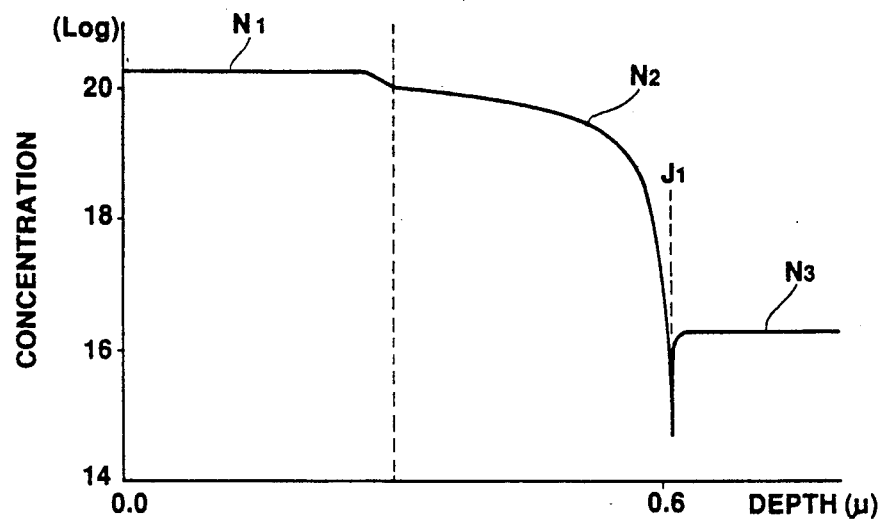
FIG. 4 is a diagram showing the distribution of the impurity concentration on the cross section along line IV—IV of FIG. 3.
Figure 5:
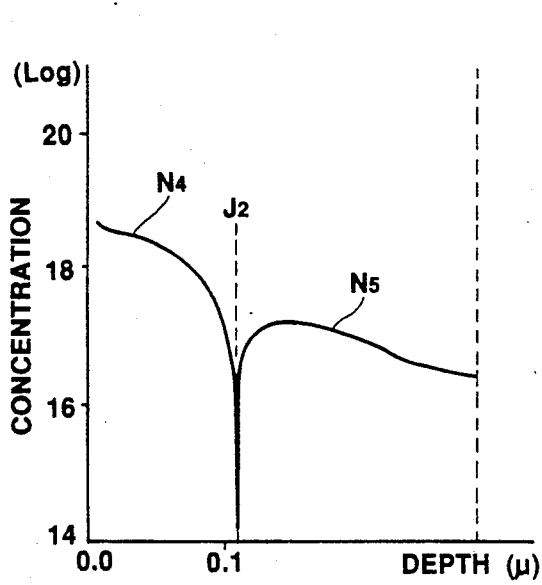
FIG. 5 is a diagram showing the distribution of the impurity concentration on the cross-section along line V—V of FIG. 3.
Figure 6:
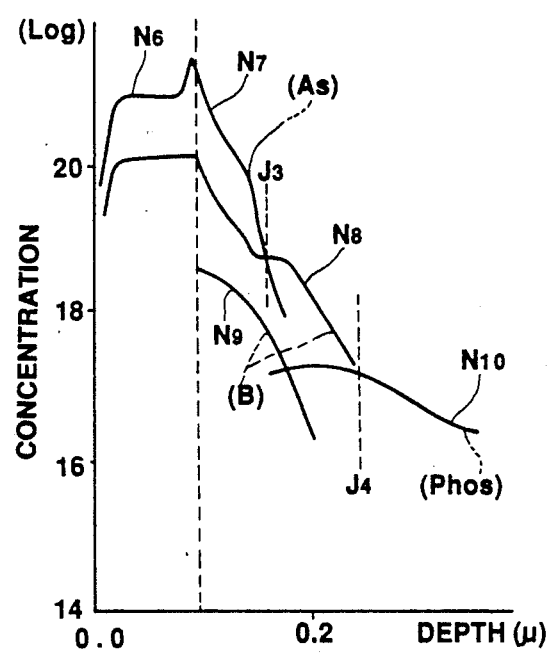
FIG. 6 is a diagram showing the distribution of the impurity concentration on the cross-section along line VI—VI of FIG. 3.

FIGS. 4 to 6 show the distribution of impurity concentration on the cross-sections taken along lines IV—IV, V—V and VI—VI in FIG. 3. In these figures, the ordinate represents the impurity concentration, shown by a logarithmic scale, and the abscissa represents the depth. It is noted that the distribution of impurity concentration shown in FIGS. 4 to 6 is roughly coincident with that on the cross-sections along lines IV'—IV', V'—V' and VI'—VI of FIG. 2.

FIG. 4 shows the distribution of impurity concentration on the cross-section IV—IV in FIG. 3. The distribution of the impurity concentration above the surface of the epitaxial layer 4 corresponds to the impurity concentration $N_1$ of the polysilicon layer 6. Since the graft base region 11 is formed by diffusing impurities from the polysilicon layer 6, the impurty concentration $N_2$ is about equal in the vicinity of the graft base region 11 to the impurity concentration $N_1$ and becomes gradually low as the junction depth $J_1$ is approached. This junction depth $J_1$ is of the order of, for example, 3110 Å. From the junction depth $J_1$ on, there prevails the impurity concentration $N_3$ of the N type epitaxial layer 4.

FIG. 5 shows the distribution of impurity concentration on the cross-section V—V in FIG. 3. From the surface of the epitaxial layer 4 on, there exists the linking base region 13, which is the P type impurity diffused layer, the impurity concentration $N_4$ of which is lowered gradually towards the junction depth $J_2$. This junction depth $J_2$ is of the order of, for example, 1100 Å. The region therebelow is the epitaxial layer 4 where there prevails the N type impurity concentration $N_5$. The distribution of the impurity concentration $N_5$ is such that a mild peak exists at a deeper zone of the junction depth $J_2$. Since this zone functions as the diffusion restraining region 15, it becomes unnecessary to increase the junction depth $J_2$ such as by heat treatment.

FIG. 6 shows the distribution of impurity concentration on the cross-section VI—VI in FIG. 3. The impurity concentration above the surface of the epitaxial layer 4 is the impurity concentration $N_6$ of the thin polysilicon layer 9. The impurity concentration has a peak on the surface of the epitaxial layer 4 and shifts to the impurity concentration $N_7$ of the emitter region 21 directly below the surface of the epitaxial layer 4. The impurity concentrations $N_6$, $N_7$ are that of arsenic (As). The impurity concentration $N_7$ of this emitter region 21 is lowered gradually towards the depth of junction $J_3$. From the depth of junction $J_3$ and as far as the depth of junction $J_4$, the impurity concentration $N_8$ of the intrinsic base region 12 prevails. This concentration $N_8$ is the impurity concentration of boron (B). Meanwhile, the distribution of the impurity concentration $N_9$ represents the overlapped distribution into the intrinsic base region 12 and into the emitter region 21 of boron forming the linking base region 13. The impurity concentration $N_{10}$ of the epitaxial layer 4 prevails at the junction depth $J_4$ of the intrinsic base region 12. This impurity concentration $N_{10}$ is that of phosporus (P) and exhibits a mild peak at the junction depth $J_4$ for forming the diffusion restraining region 15. Considering the depth of junction from the distribution of these impurities, a peak of phosphorus having the opposite conductivity type to that of the intrinsic base region 12 exists in the vicinity of the junction depth $J_4$. Therefore, even supposing that boron, the impurities of the intrinsic base region 12, is diffused in the depthwise direction, the function proper to the impurity concentration $N_{10}$ prevailing in the diffusion restraining region 15 is effective to prevent the junction depth $J_4$ from being increased disadvantageously in order to provide for a higher performance of the bipolar transistor. Meanwhile, the junction depth $J_4$ is about 1500 A from the surface, while the junction depth $J_2$ of the linking base region 13 is about 1100 A, as shown in FIG. 5, the junction depth $J_4$ is deeper than the depth of junction $J_2$, ($J_4 > J_2$). Hence, the effective base width of the parasitic base region becomes narrower to suppress the side injection effect.

In the above described bipolar transistor, the depth of junction may be prevented from being increased by the function proper to the diffusion suppressing region 15. In this manner, the base midth $W_B$ may be prevented from being increased, so that it becomes possible to increase the operating speed of the device. As described hereinabove, the junction depth $J_4$ of the intrinsic base region 12 is selected to be deeper than the junction depth $J_2$ of the linking base region 13. As a result, the effective base width of the parasitic base region is reduced to suppress the effect of side injection.

In the bipolar transistor of the present invention, the concentration of impurities introduced for forming the diffusion suppressing region 15 may be selected to be higher than the impurity concentration in the N type epitaxial layer 4 to suppress the Kerk effect. Also the low consumption type bipolar transistor and the high speed bipolar transistor may be selectively produced by controlling the values of the impurity concentration. The bipolar transistor may be of the PNP type in lieu of the NPN type of the above described illustrative embodiments.

Referring to FIGS. 7a to 7d, the process for producing the above described bipolar transistor will be explained in the sequence of the production steps thereof.

Figure 7:
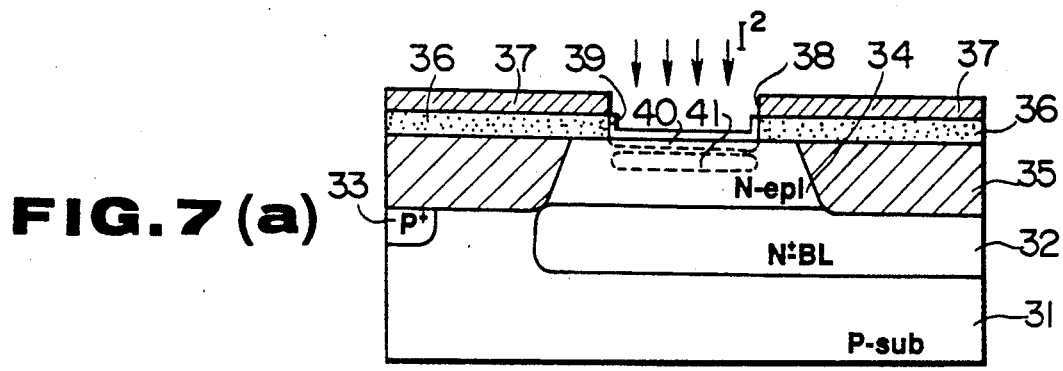
FIGS. 7a to 7d are cross-sectional views for illustrating the method for producing the bipolar transistor of the present invention according to the production sequence thereof.
Figure 7:
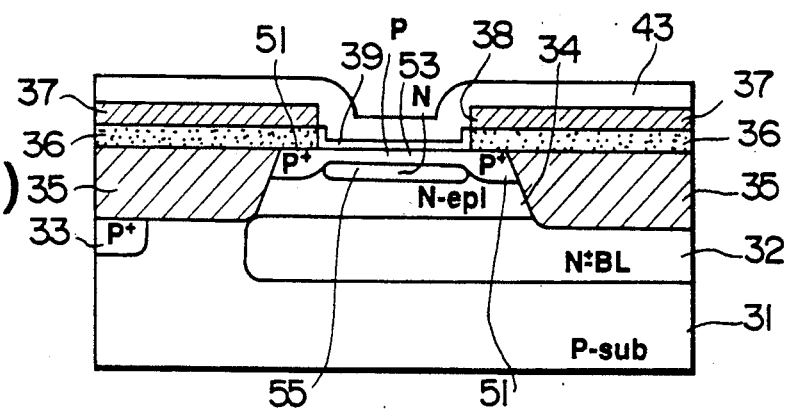
Figure 7:
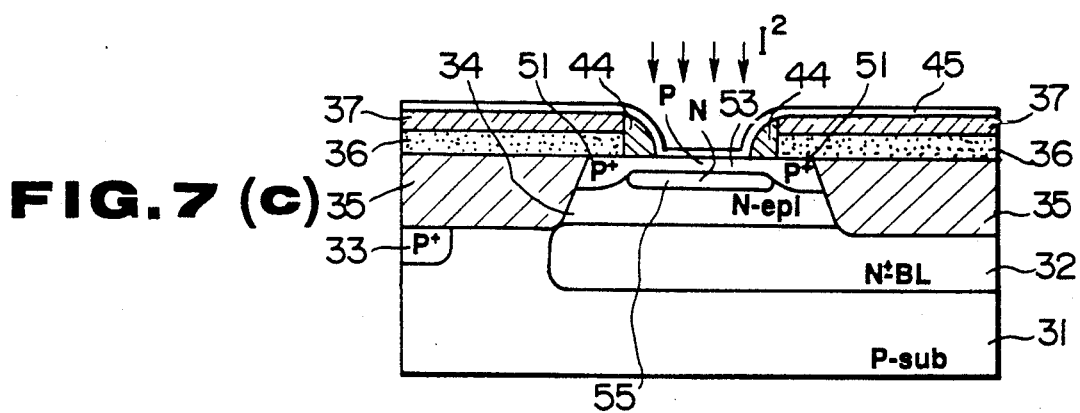
Figure 7:
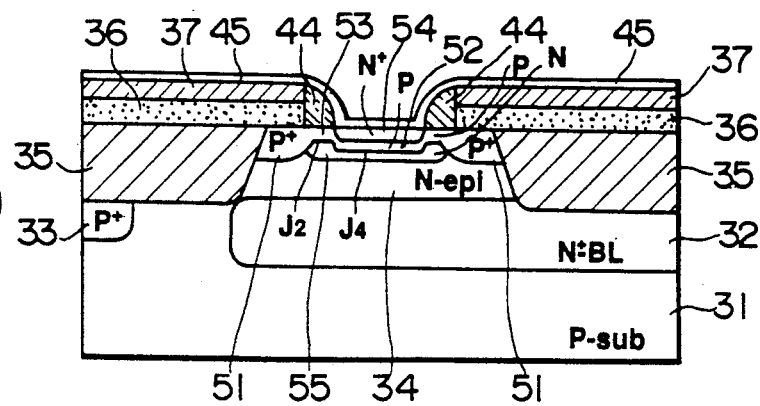

First, as shown in FIG. 7a, an N type buried layer 32 is formed on a P type single crystal silicon substrate 31. The N type buried layer 32 is selectively formed for linking with the collector contact region. An epitaxial layer 34 is then formed on this P type silicon substrate 31. A field oxide film 35, functioning as the device isolation region, is formed on the epitaxial layer 34 by selective oxidation. A channel stop region for device isolation 33 is formed on the bottom side of the field oxide film 35, while the surface of the field oxide film 35 is flattened. On the top of the epitaxial layer 34 surrounded two-dimensionally by this field oxide film 35 is formed a polysilicon layer 36 containing P type impurities. The P type impurities may include $B^+$ or $BF_2^+$. This polysilicon layer 36 is roughly patterned to the profile of the base contact electrode and then covered by an interlayer insulating film 37. This polysilicon layer 36 and the interlayer insulating film 37 are selectively formed for facing to the major surface of the epitaxial layer 34, and are opened partially to form an opening 38, on which a thin oxide film 39 used as a buffer film is formed to a film thickness e.g. of 150 A.

After formation of the oxide film 39, the linking base region is formed by ion implantation. Dopants used for this ion implantation may include, for example, $B^+$ and $BF_2^+$, and one implanted into a region 40 in the vicinity of the major surface of the epitaxial layer 34 so as not to increase the depth of the linking base region. It will be noted that the impurities are not introduced into the zone below the polysilicon layer 36 since the layer 36, above all, functions as the mask.

Then, ion plantation is performed at the same opening 38 for forming the diffusion suppressing region through the oxidation film 39. This ion implantation is performed with the use of impurities such as $P^+$ or $A_s^+$ in such a manner that the impurities are implanted into a region 41 which is deeper than the region where the linking base region or the intrinsic base region is to be formed. The Kerk effect may be suppressed by positively increasing the concentration of the impurities used for ion implantation. Also the low consumption type bipolar transistor and the high speed type bipolar transistor may be selectively produced by controlling the concentration of the impurities used in the ion implantation.

A thick oxide film 43 is then formed on the overall surface by, for example, chemical vapor deposition (CVD). The opening 38 having the thin oxide film 39 on the bottom thereof is similarly covered by the thick oxide film 43.

Then, as shown in FIG. 7b, the impurities are diffused by heat treatment from the polysilicon layer 36 which is to be the aforementioned base contact electrode, for forming a graft base region 51. On annealing, the impurities implanted into the region 40 form a linking base region 53 in the vicinity of the major surface of the epitaxial layer 34 on the bottom of the opening 38. Similarly, the impurities implanted into the region 41 form a diffusion suppressing region 55 on annealing below the linking base region 53.

The thick oxide film 43, that also functioned as the anneal cap, is then etched back and caused to remain on the sidewall of the opening 38 as sidewall sections 44. The oxide film 39 within the opening 38 is simultaneously removed.

Meanwhile, for producing a bipolar transistor having a step 20, as shown in FIG. 3, it suffices to perform etching of silicon after the etching back process to remove a surface portion of the epitaxial layer 34.

A thin polysilicon layer 45 is then formed on the overall surface. This polysilicon layer 45 is extended from the upper surface of the interlayer insulating film 37 over the sidewall section 44 and from the sidewall section 44 over the major surface where the epitaxial layer 34 is formed.

Then, as shown in FIG. 7c, ion implantation is performed on the overall surface. By this ion implantation, there are introduced impurities into the thin polysilicon layer 45. These impurities, which may for example be $B^+$ or $BF_2^+$, form the intrinsic base region 52 on the major surface of the epitaxial layer 34. It will be noted that, since the sidewall section 44 functions as the mask for ion implantation and diffusion of impurities, the linking base region 53 is caused to remain below the sidewall section 44. In the region facing to the opening between the sidewall sections 44, 44, the intrinsic base region 52 is formed by the subsequent annealing in an offset relation with respect to the graft base region 51 and in an overlapping relation with respect to the linking base region 53.

Annealing is then performed for forming the intrinsic base region 52. During this annealing, the silicon oxide film is capped. The intrinsic base region 52 is formed by diffusing impurities from the polysilicon layer 45 so as to have the depth of junction $J_4$ deeper than the depth of junction $J_2$ of the linking base region 53. The base width $W_B$ of the intrinsic base region 52 may also be prevented from being increased due to the previously formed diffusion suppressing region 55 below the intrinsic base region 52.

The silicon oxide film on the surface is then removed, and ion implantation is again performed into the polysilicon layer 45. By the impurities used for this ion implantation, which may, for example, be $A_s^+$, an emitter region 54 is formed. This formation is achieved by diffusion from the polysilicon layer 45 on heat treatment to produce the bipolar transistor as shown in FIG. 7d.

By the above described sequence of operations, the bipolar transistor may be obtained which is provided with the diffusion suppressing region 55, as described hereinabove. In this bipolar transistor, a low base resistance $R_{bb'}$ is realized by the linking base region, while simultaneously the adverse effects such as deterioration in voltage withstand properties of the emitter-base junction, $V_{BE}$ matching properties or in the value of $f_T$, are suppressed. The process of forming the linking base region 53 is separate from that of forming the intrinsic base region 52, so that the relation of the junction depth $J_4$ of the intrinsic base region 52 being larger than the junction depth $J_2$ of the linking base region 52 may be obtained by proper control of the duration, impurity concentration and temperature of the respective processes. As a result, the side injection effect may be restricted. On the other hand, the base width $W_B$ may be prevented from being increased due to the function of the diffusion suppressing region 55, whereas, subject to proper control of the impurity concentration thereof, the Kerk effect may be suppressed, or a lower power consumption device or a high speed device may be produced.

I claim as my invention:

1. A process for fabricating a bipolar transistor comprising;

providing a semiconductor substrate of a first conductivity type, forming an epitaxial layer on the surface said semiconductor substrate, selectively oxidizing said epitaxial layer to form a field oxide layer surrounding a device forming region two-dimensionally, forming a device forming region surrounded two-dimensionally by said field oxide film, forming a base contact electrode layer confronted by said device forming region, said base contact electrode layer containing impurities and covered by an insulating layer, opening said base contact electrode layer covered by said insulating film to form an opening in said device forming region, introducing impurities forming a linking base region and a diffusion suppressing region into said device forming region via said opening to a predetermined depth, diffusing impurities from said base contact electrode layer by heat treatment to form a graft base region, forming sidewall spacers on the side walls of said opening in said base contact electrode layer, forming an intrinsic base region in contact with said linking base region and to a deeper diffusion depth than the diffusion depth of said linking base region, using said sidewall spacers as the mask, and forming an emitter region in said intrinsic base region.

2. The process according to claim 1 wherein, after forming said sidewall spacers, a thin polysilicon layer is formed from the surface of said device forming region along the surface of said sidewall spacer and wherein said intrinsic base region and said emitter region are formed by diffusing impurities from said thin polysilicon layer.

3. The process according to claim 1 wherein, after forming said sidewall spacers, the surface of said device forming region is removed to form a step, wherein said intrinsic base region is formed in said device forming region provided with said step in contact with said linking base region and to a deeper diffusion depth than the diffusion depth of said linking base region and wherein said emitter region is formed in said intrinsic base region.

* * * * *